US010211848B1

(12) United States Patent
Shen et al.

(10) Patent No.: US 10,211,848 B1
(45) Date of Patent: Feb. 19, 2019

(54) DELTA SIGMA MODULATOR SYSTEMS AND METHODS

(71) Applicant: SYNAPTICS INCORPORATED, San Jose, CA (US)

(72) Inventors: Dan Shen, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/937,764

(22) Filed: Mar. 27, 2018

(51) Int. Cl.
H03M 3/00 (2006.01)

(52) U.S. Cl.
CPC .......... *H03M 3/438* (2013.01); *H03M 3/422* (2013.01)

(58) Field of Classification Search
USPC ........................................ 341/143, 155, 147
See application file for complete search history.

(56) References Cited

U.S. PATENT DOCUMENTS

| 6,639,531 | B1 | 10/2003 | Melanson |
| 6,920,182 | B2 | 7/2005 | Bolton, Jr. |
| 7,230,556 | B2 | 6/2007 | Rivoir |
| 7,385,538 | B2 | 6/2008 | Riley |
| 7,446,686 | B2 | 11/2008 | Rueger et al. |
| 7,474,441 | B2 * | 1/2009 | Karito .................. H04N 1/4052 358/3.01 |
| 7,863,849 | B2 | 1/2011 | McLeod et al. |
| 9,065,471 | B1 | 6/2015 | Okuda |
| 9,178,529 | B2 * | 11/2015 | Dong .................... H03M 3/344 |
| 2004/0032355 | A1 * | 2/2004 | Melanson ............. H03M 3/338 341/143 |
| 2004/0223576 | A1 * | 11/2004 | Albasini ............... H03L 7/0891 375/376 |
| 2011/0006937 | A1 * | 1/2011 | Zoso ..................... H03M 3/422 341/143 |
| 2012/0049907 | A1 * | 3/2012 | Da Dalt .................. H03L 7/16 327/147 |
| 2013/0021187 | A1 * | 1/2013 | Xia ..................... H03M 1/1028 341/155 |
| 2013/0271304 | A1 * | 10/2013 | Belot .................... H03M 3/484 341/143 |
| 2014/0113575 | A1 * | 4/2014 | Mitani .................... H03M 3/44 455/78 |

OTHER PUBLICATIONS

Schreier, Richard et al., Understanding Delta Sigma Data Converters, pp. 1-446, A John Wiley & Sons, Inc. Publication.

* cited by examiner

*Primary Examiner* — Jean B Jeanglaude
(74) *Attorney, Agent, or Firm* — Haynes and Boone, LLP

(57) ABSTRACT

Systems and methods according to one or more embodiments are provided for improving noise performance in a delta sigma modulator comprising an adder, quantizer and nth order filter. The adder is operable to receive an input signal and a feedback signal, and output a modified input signal. The quantizer is operable to receive the modified input signal and output a quantized output signal, the quantized output signal having a corresponding quantization error. The nth order filter is operable to receive a quantization error value and generate the feedback signal, the nth order filter comprising a first memory element having a first error value, a second memory element having a second error value, and a gravity component operable to converge the first error value and the second error value when the input signal is approximately zero.

20 Claims, 9 Drawing Sheets

DELTA SIGMA MODULATOR SYSTEMS AND METHODS

TECHNICAL FIELD

The present invention relates generally to data converters and, more particularly for example, to systems and methods for improving noise performance in a delta sigma modulator.

BACKGROUND

Delta-sigma modulators are commonly used for converting between analog signals and digital signals and converting from a high sample rate to a low sample rate, and may be implemented for example, in a digital-to-analog converter, analog-to-digital converter, or a delta-sigma phase locked loop (PLL). An error feedback delta sigma modulator may be used in certain designs for added stability. An example of a second order error feedback delta-sigma modulator 100 is illustrated in FIG. 1. In the illustrated example, an input signal u is combined with an output of a feedback filter 110 to generate a modified input signal y having a first sample rate n. The modified input signal y is provided to a quantizer 104, which outputs a corresponding signal v at a lower sample rate m. The quantizer 104 introduces quantization error E when the least significant bits of the modified input signal y are removed to form the output signal v. The quantized value v is fed into the feedback filter 110 to generate a correction to be applied in the next iteration. The quantized value v is subtracted from the input signal y at 108 to produce the error value E. The error E is fed back to the input signal through the feedback filter 110, having an impulse response given by the transfer function $H_f(z)=-2z^{-1}+z^{-2}$. The z-domain output of the feedback filter 110 is combined with the input signal at 112 to produce the modified input signal y. Using the delta-sigma demodulator 100, the output signal v can represent the input signal u, but with less bits, in average fashion.

One drawback with conventional delta-sigma modulators, such as delta-sigma modulator 100, is that when the input signal is zero (or very small), the output signal may continue to produce a series of output values. For example, when the signal is zero or very small or a dc signal that includes only most significant bits (MSBs), but without least-significant bits (LSBs), a delta-sigma output can form a limited cycle outputting signals between 0 and 1, which can degrade out-of-band noise. Out-of-band noise may get aliased back into the baseband signal due to limited bandwidth of an analog digital to analog converter following this digital delta sigma modulator. System requirements for some applications, such as audio headphones applications, may require out of band noise to be below certain level for final line-out or headphone output. Thus, there is a continued need to improve the performance of delta-sigma modulators.

SUMMARY

The present disclosure provides systems and methods that address a need in the art for improved noise performance in a delta sigma modulator. The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

The included drawings are for illustrative purposes and serve only to provide examples of possible systems and methods for sensing current in an audio system. These drawings in no way limit any changes in form and detail that may be made to that which is disclosed by one skilled in the art without departing from the spirit and scope of this disclosure.

DETAILED DESCRIPTION

The present disclosure provides systems and methods that address a need for improved noise performance in a delta sigma modulator. Digital sigma delta modulators are popular for achieving high resolution output with fewer bits, and are widely used in data converters, phase locked loops (PLLs) and other applications. It is observed that conventional delta sigma modulators (e.g., as implemented in a class-D amplifier) may generate limited cycle oscillation even as the input becomes very small. Those limited cycle oscillations can create undesirable out of band noise if it is locked into certain oscillating patterns. Out of band noise generated by a sigma-delta modulator may create in-band noise through mixing with other electrical components. Embodiments are disclosed herein to improve the out of band noise performance of a digital sigma delta modulator.

In accordance with various embodiments disclosed herein, a circuit includes a delta-sigma modulator and an error feedback loop. The error feedback loop is operable to apply a gravity effect to certain memory elements to drive an oscillating output of the delta-sigma modulator to zero when the input goes to zero. As a result, out of band noise may be reduced to zero when the input is zero. As disclosed herein, the gravity effect provides a continuous smooth transition from normal modulation of an input signal to zero output, adding no in-band noise or discontinuity during the transition. The delta-sigma modulator disclosed herein may be implemented in variety of delta-sigma circuits, including delta-sigma data converters and phase locked loops, for example.

Figure 1:
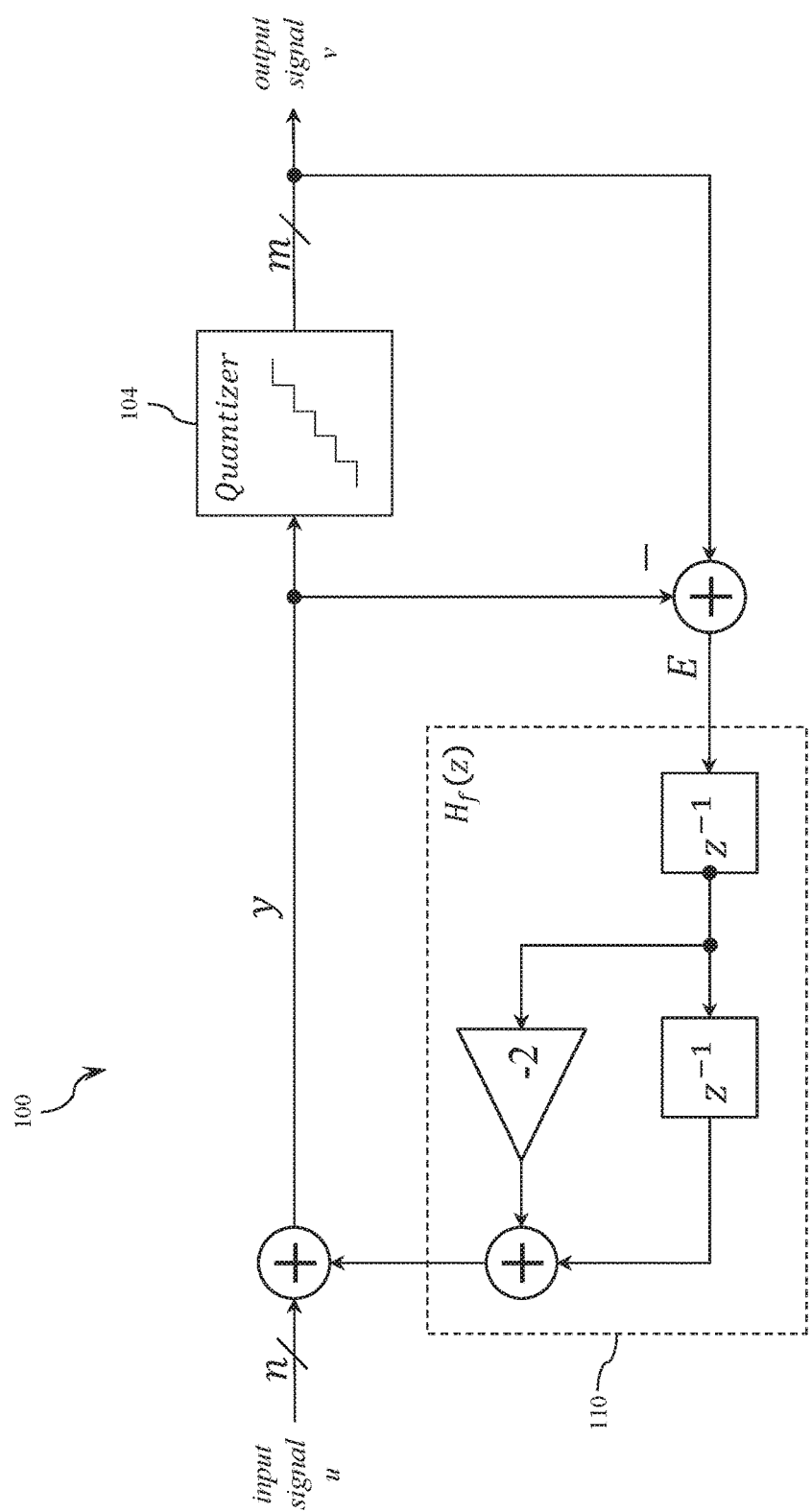
FIG. 1 illustrates a conventional second order delta-sigma modulator with an error-feedback path.
Figure 2:
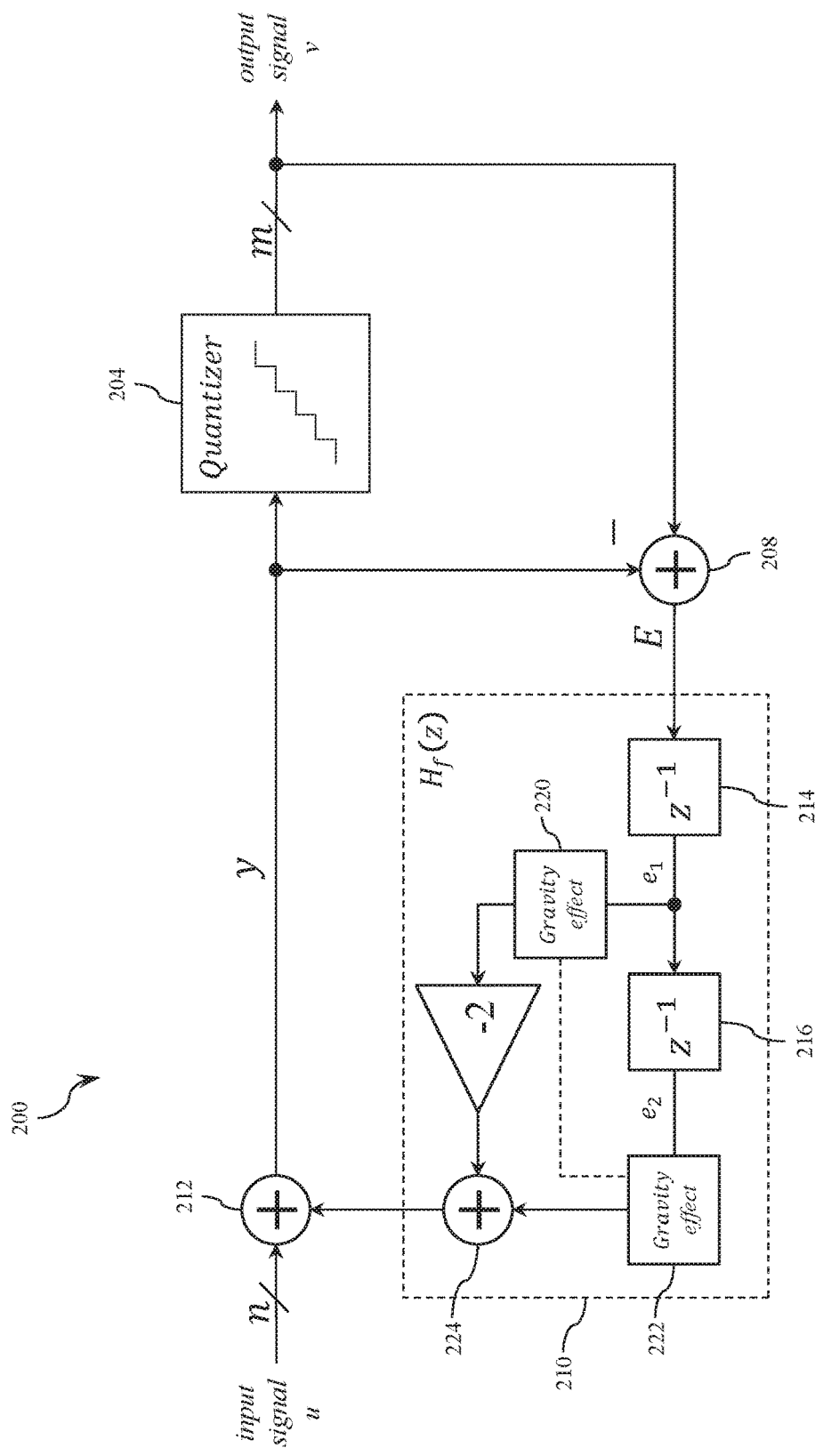
FIG. 2 illustrates an exemplary delta-sigma modulator, in accordance with an embodiment of the disclosure.

Referring to FIG. 2, a delta-sigma modular will now be described in accordance with one or more embodiments. A delta-sigma modulator 200 receives an input signal u having a sample rate n. The input signal u is combined with the output of a feedback filter 210 through an adder 212 to produce a modified input signal y. The modified input signal y is fed to quantizer 204, which outputs a corresponding signal v having a lower sample rate m. Using the delta-sigma modulator 200, the output signal v can represent the input signal u, but with fewer bits, in average fashion. The quantizer 204 introduces quantization error E when the least significant bits of the modified input signal y are removed to form the output signal v. The quantized value v is fed into the feedback filter 210 to generate a correction signal to be applied to the input signal n at 212 in the next iteration.

The quantized value v is subtracted from the modified input signal y by subtractor 208 to produce the error E. The error E is fed back to the input signal through the feedback filter 210 and the z-domain output of the feedback filter 210 is combined with the input signal at 212 to produce the modified input signal y. It is observed that the delta-sigma modulator 200 output v will be zero when the input u is zero if the first memory element $e_1$ (output of delay element 214) and second memory element $e_2$ (output of delay element 216) are equal. For example, if $e_1=e_2=a$ and the input u to the delta-sigma modulator 200 is zero, then the input to the quantizer 204 will be: $2e_1-e_2=-2a+a=a$. Then $e_1$ will be equal to a and $e_2$ will be also be equal to a, and the output v generated by the delta-sigma modulator 200 will be zero. This is a desired pattern that produces a delta-sigma modulator output equal to zero, without undesirable in-band or out-of-band noise.

In various embodiments, a gravity effect is introduced to achieve $e_1=e_2$ when the input signal u is zero. The gravity effect operates to converge the values $e_1$ and $e_2$ when the input signal is zero, without impacting the performance of the delta-sigma modulator 200 for other input values. In one embodiment, for each cycle when new $e_1$ and $e_2$ values are calculated, a small value is added to move the memory elements closer. For example, if $e_1$ is calculated to be 113, while $e_2$ is calculated to be 3411, then a new $e_1$ may be adjusted to 114 (added one LSB code from the calculated value 113), while $e_2$ may be set to be 3410 (reduced one LSB code from calculated value, which is 3411). When $e_1$ is approximately equal to $e_2$, both values can be set to zero (or otherwise equivalent value) at the same time without changing the delta-sigma modulator 200 output. The added LSB codes to the memory elements $e_1$ and $e_2$ will create some noise, but the added noise is relatively small (for example, 2 LSBs out of 2^24 LSBs), and the effect may be close to white noise, without affecting in-band noise. In other embodiments, a similar gravity effect can be implemented with any order digital delta-sigma modulator by applying the gravity effect to converge multiple error values in accordance with the teachings of the present disclosure.

Figure 3:
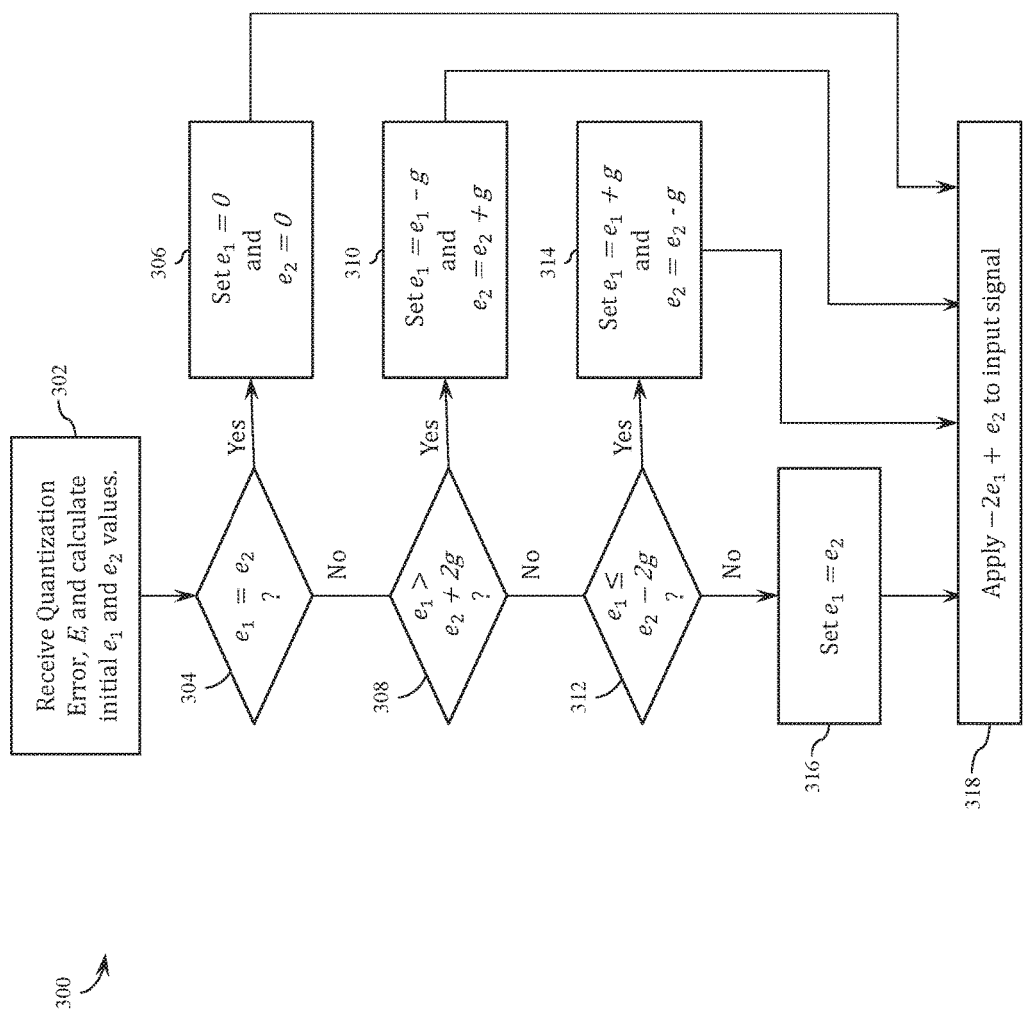
FIG. 3 illustrates an exemplary process flow for a converging delta-sigma modulator, in accordance with an embodiment of the disclosure.

As illustrated in FIG. 2, a gravity effect 220 is applied to $e_1$ and a gravity effect 222 is applied to $e_2$. In various embodiments, the gravity effect may be applied separately to each memory element, or through a single block, such as part of adder 224. In some embodiments, the gravity effects 220 and 222 may comprise distinct algorithms and gravity values. An exemplary process flow 300 for applying a gravity effect in a converging delta-sigma modulator is illustrated in FIG. 3. It will be understood that the operations illustrated in FIG. 3 may be implemented through hardware, firmware or a combination thereof.

In step 302, a new quantization error, E, is received at the error feedback filter and initial values for memory elements $e_1$ and $e_2$ are calculated. At step 304, if $e_1$ equals $e_2$, both values are set to 0 (step 306) and the transfer function $-2e_1+e_2$ is applied to the input signal u in step 318. Otherwise, in step 308 if $e_1$ is greater than $e_2+2$ times a gravity value g, then the value of $e_1$ is decremented by g and the value of $e_2$ is incremented by g (step 310) to slowly converge the values of $e_1$ and $e_2$. The transfer function $-2e_1+e_2$ is applied to the input signal u in step 318 with the new values of $e_1$ and $e_2$ from step 310. In step 312, if $e_1$ is less than or equal to $e_2-2$ times the gravity value g, then the value of $e_1$ is incremented by g and the value of $e_2$ is decremented by g (step 314) to slowly converge the values of $e_1$ and $e_2$. The transfer function $-2e_1+e_2$ is applied to the input signal u in step 318 with the new values of $e_1$ and $e_2$ from step 314. If none of the conditions from steps 304, 308 or 312 are true, then $e_1$ and $e_2$ are substantially close (e.g., less than 2 g apart), and in step 316 the value of $e_1$ is set to $e_2$. The transfer function $-2e_1+e_2$ is then applied to the input signal u in step 318 with the new values of $e_1$ and $e_2$ from step 316.

Figure 4A:
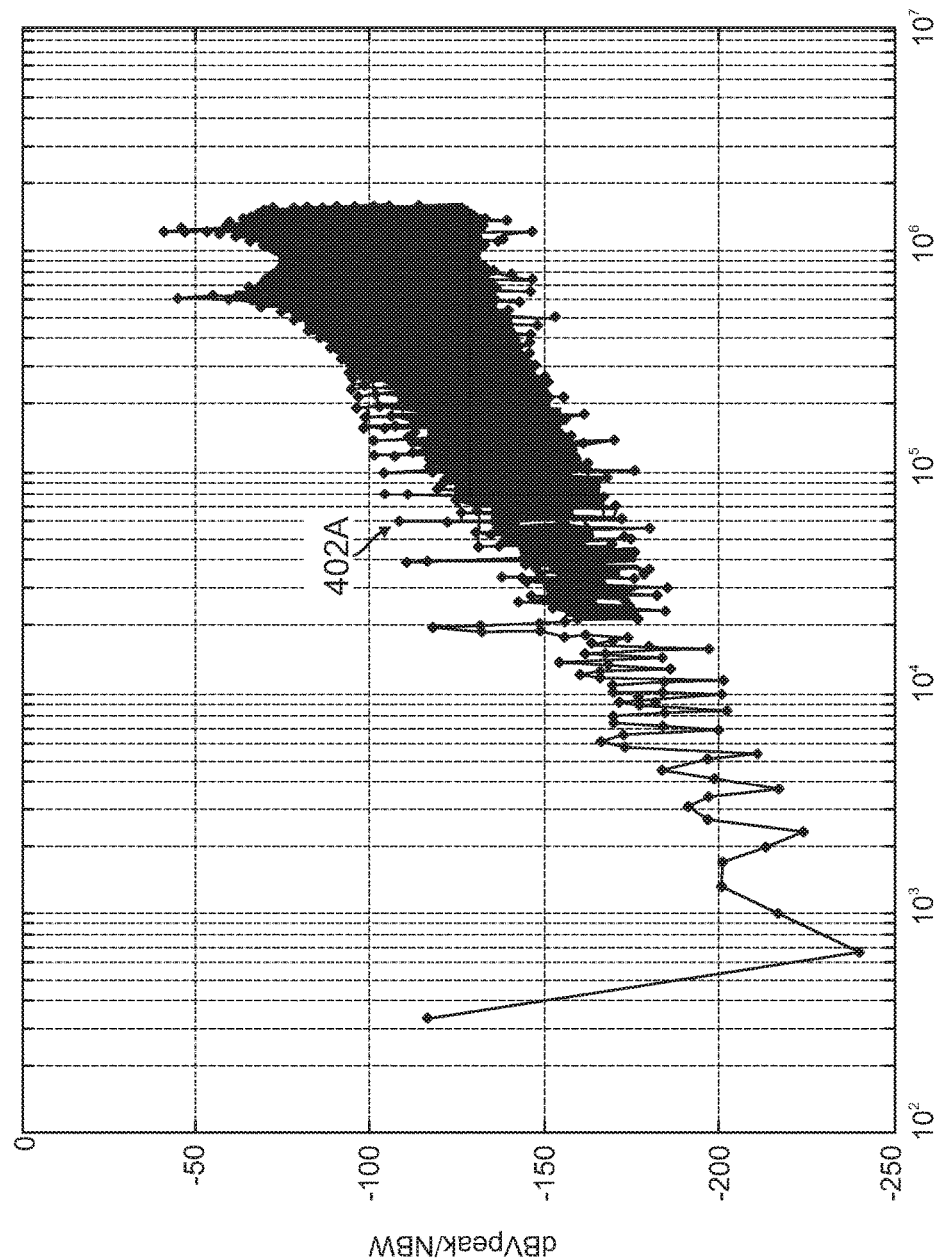
FIGS. 4A-C illustrate example output spectra from a delta-sigma modulator.
Figure 4B:
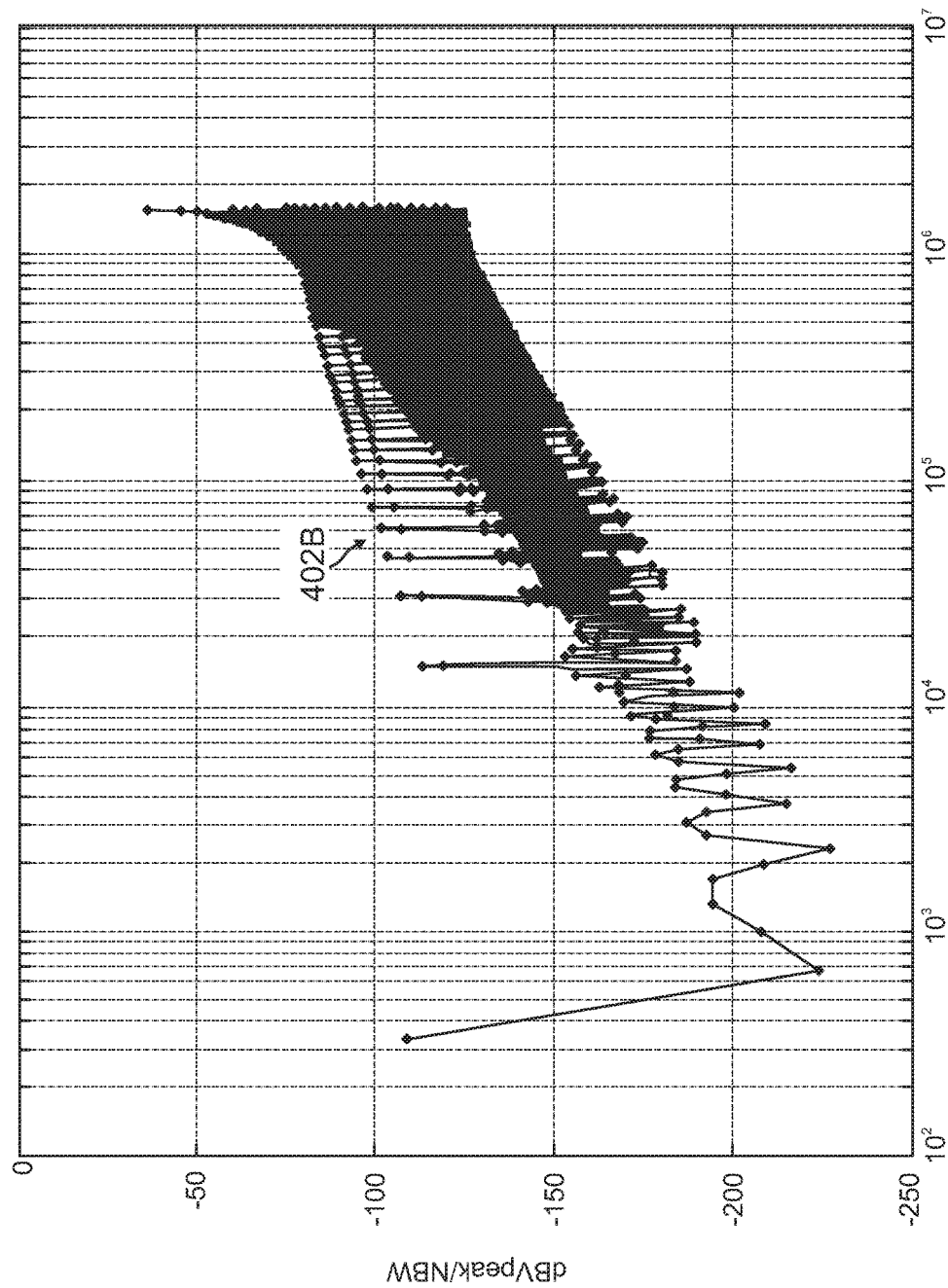
Figure 4C:
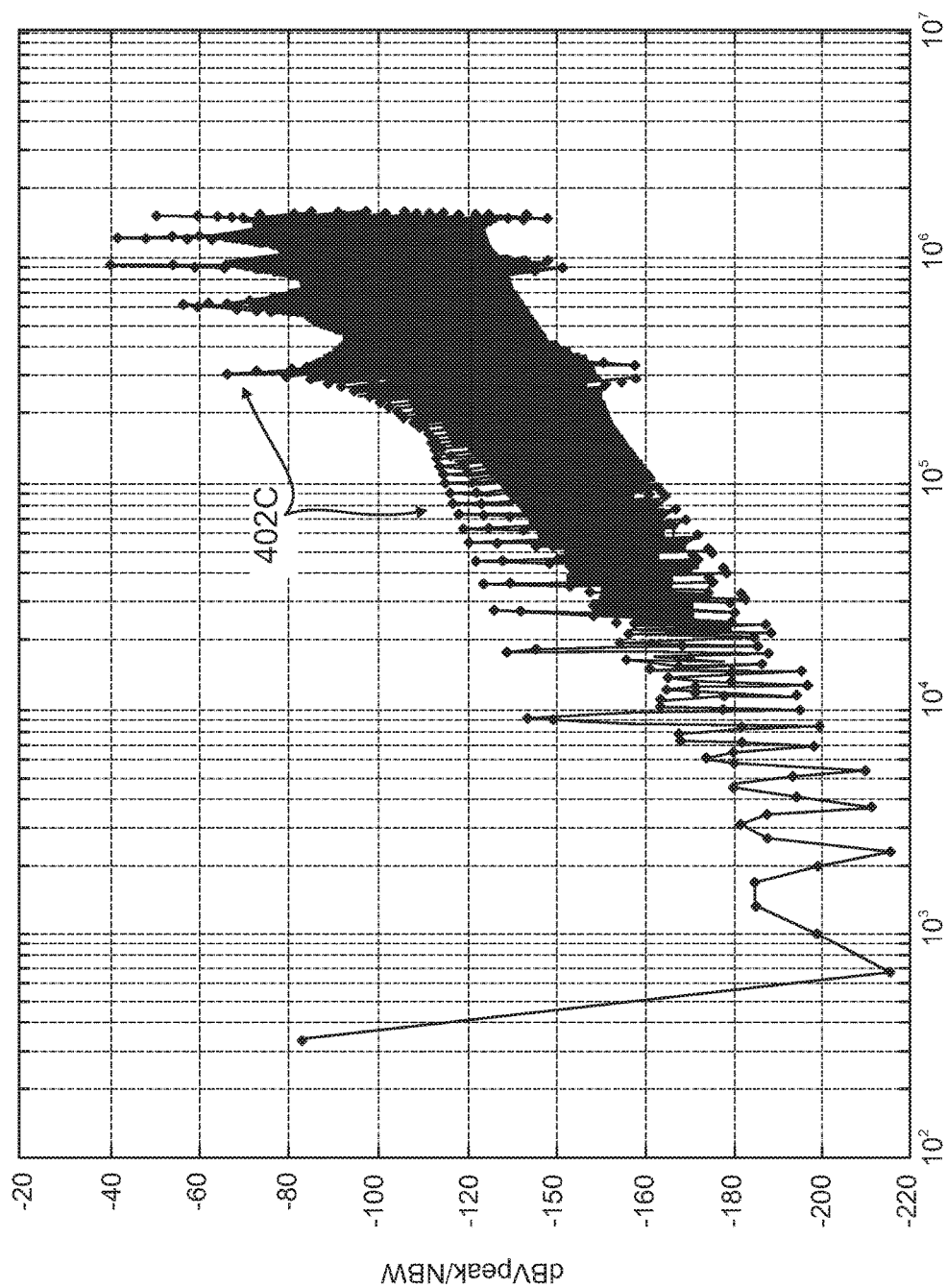
Figure 5:
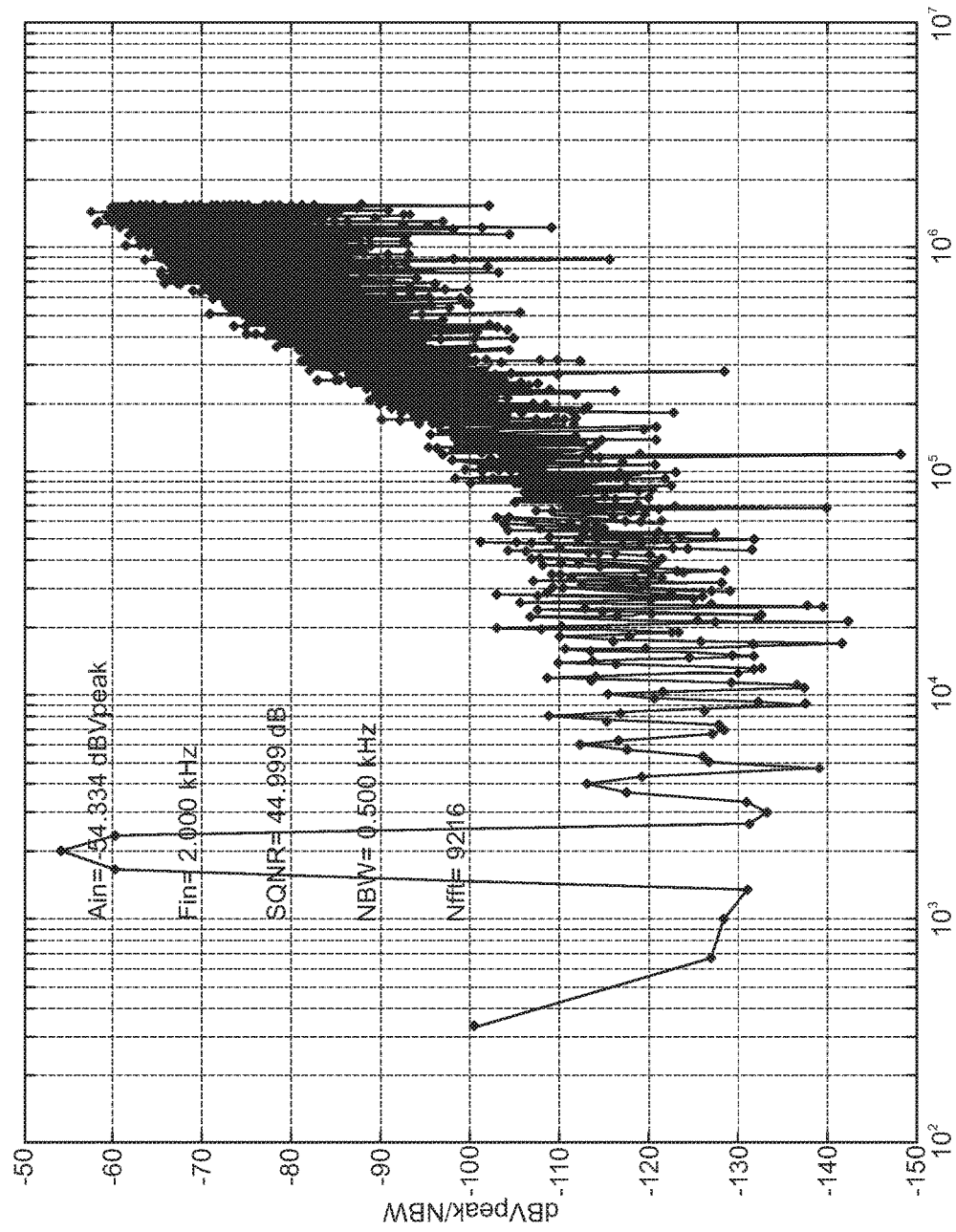
FIG. 5 illustrates example output spectra when the input signal to a delta-sigma modulator goes to zero, in accordance with one or more embodiments of the disclosure.

The systems and methods disclosed herein provide for a delta-sigma modulator having an output that reliably goes to zero when the input signal is zero or small, without affecting delta-sigma modulator performance when other input signal values are received. Exemplary spectrum output charts for a conventional delta-sigma modulator are illustrated in FIGS. 4A-C. As illustrated, an out of band signal can sometimes go out of control in a conventional delta-sigma modulator and lock into different oscillation patterns (see 402A, 402B and 402C). As shown in FIG. 5, a spectrum output of a delta-sigma modulator implementing an embodiment of the gravity effect of the present disclosure has a small out of band signal when input goes to zero. As verified in test simulations, the delta-sigma modulator output goes to zero reliably and there is no significant degradation of noise performance compared to conventional delta-sigma modulators.

In various embodiments, the delta-sigma modulator disclosed herein may be implemented with data converters, frequency synthesizers or other delta-sigma implementations. In some embodiments, the delta-sigma modulator of the present disclosure can provides a signal to subsequent circuit blocks to shut down or enter a low power mode when the delta-sigma modulator output is zero. The disclosed delta-sigma modulator may also work with different order modulators, by driving each error together, such as by converging the memory element values towards an average value or driving the errors towards one or more of the other memory element values.

Figure 6:
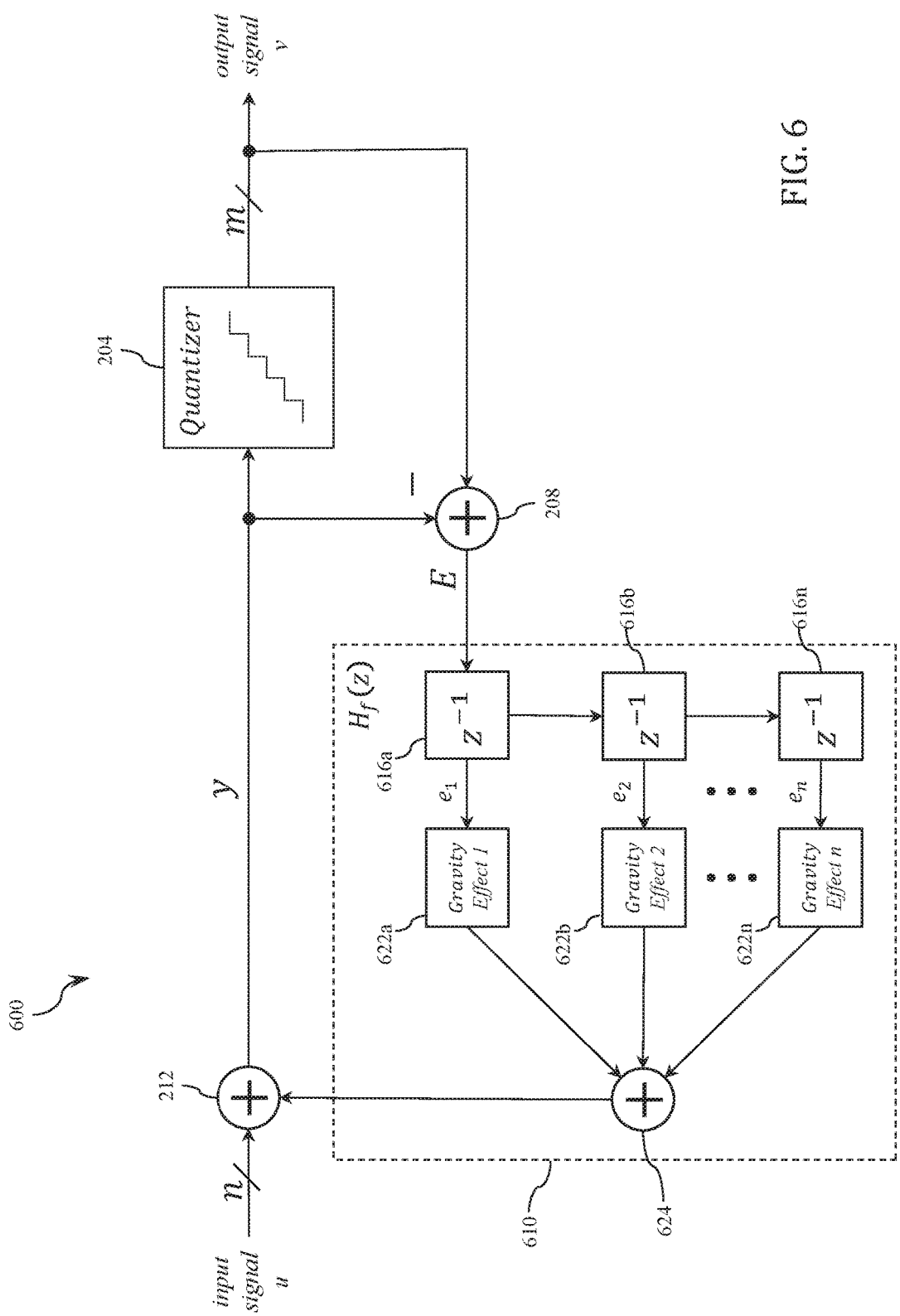
FIG. 6 illustrates an exemplary delta-sigma modulator having an $n^{th}$ order error-feedback loop, in accordance with an embodiment of the disclosure.

FIG. 6 illustrates an exemplary embodiment of a delta-sigma modulator 600 including an $n^{th}$ order error feedback loop 610. The $n^{th}$ order error feedback loop 610 receives the quantization error E as input and includes n delay units (616a, 616b to 616n) operable to store corresponding error values $e_1, e_2 \ldots e_n$, representing quantization error in received in n preceding clock cycles. A corresponding gravity effect 622a, 622b $\ldots$ 622n is applied to each respective error value $e_1, e_2 \ldots e_n$. In one embodiment, the error values $e_1, e_2 \ldots e_n$ are averaged in each cycle and each corresponding gravity effect 622a, 622b $\ldots$ 622n is operable to converge its respective error value $e_1, e_2 \ldots e_n$ towards the average error value using a small gravity effect. In one embodiment, the gravity effect is selected as a fixed step size that is small enough to avoid creation of undesirable in-band noise as determined by system requirements. The gravity effect may be applied, for example, as a step size g that is added or subtracted to an error value each cycle to step the error value towards the average error value. In one embodiment, if an error value is within 2 g of the average error value, the error value may be set to the average. After the gravity effects are applied, the resulting error values are combined at 624 to provide a filter response given by the transfer function $H_f(z)$. In operation, the small gravity effect will create some noise in the presence of the input signal u, but the added noise is relatively small and the effect may be close to white noise, without affecting in-band noise in the output signal v. When the input signal u goes to zero, the small gravity effect will cause the error values $e_1, e_2 \ldots e_n$ to converge and the resulting output signal v will go to zero.

Figure 7:
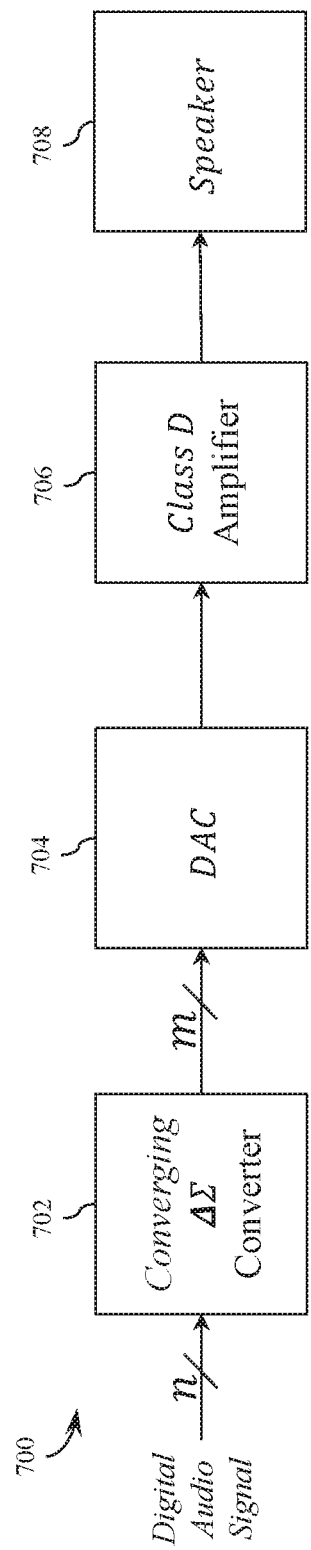
FIG. 7 illustrates an exemplary audio output stage, in accordance with an embodiment of the present disclosure.

Referring to FIG. 7, an audio output stage 700 is illustrated in accordance with an embodiment of the present disclosure. A digital audio signal having a first sample rate, n, is received and input to a converging delta-sigma converter 702, such as the delta-sigma modulator 200 of FIG. 2. The converging delta-sigma converter 702 down samples the digital audio signal to an output signal having a lower sample rate, m. A digital-to-analog converter 704 converts the digital audio sample to an analog audio signal which is fed to a class D amplifier 706 for driving a speaker 708. In various embodiments, if the digital audio signal is no longer present or very small, then the output of the converging delta-sigma converter 702 (and the audio output stage 700) will go to zero.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A circuit comprising:
   an adder operable to receive an input signal and a feedback signal, and output a modified input signal;
   a quantizer operable to receive the modified input signal and output a quantized output signal, the quantized output signal having a corresponding quantization error; and
   an nth order filter operable to receive a quantization error value and generate the feedback signal, the nth order filter comprising:
      at least n memory elements, each memory element operable to store quantization error value information corresponding to one of n previous clock cycles;
      a gravity component operable to converge the quantization error value information to produce modified quantization error values; and
      a feedback signal generator operable to generate the feedback signal using the modified quantization error values.

2. The circuit of claim 1 wherein the input signal has a first data width and the quantized output signal has a second data width, which is less than the first data width.

3. The circuit of claim 1 further comprising a subtractor operable to receive the modified input signal and subtract the quantized output signal to generate the quantization error value.

4. The circuit of claim 1 wherein n equals 2 wherein the nth order filter further comprises a first memory element storing a first error value and a second memory element storing a second error value, and wherein the gravity component is operable to add a gravity value to a lesser of the first error value and the second error value.

5. The circuit of claim 4 wherein the gravity component is operable to subtract the gravity value from a greater of the first error value and the second error value.

6. The circuit of claim 4 wherein the gravity component is operable to set the first error value equal to the second error value when the first error value minus the second error value is less than two times the gravity value.

7. The circuit of claim 1 wherein n=3, and wherein the nth order filter comprises a first memory element storing a first error value, a second memory element storing a second error value, a third memory element storing a third error value, and wherein the gravity component is operable to converge the first error value, the second error value and the third error value.

8. A method comprising:
   adding an input signal and a feedback signal to produce a modified input signal;
   quantizing the modified input signal to generate a quantized output signal, the quantized output signal having a quantization error; and
   generating the feedback signal through an nth order filter from successive quantization error values, wherein generating the feedback signal comprises:
      generating a first error value from a first memory element, the first error value representing the quantization error of a preceding cycle;
      generating a second error value from a second memory element, the second error value representing the quantization error from a second preceding cycle; and
      applying a gravity effect to the first error value and the second error value, wherein the gravity effect converges the first error value and the second error value.

9. The method of claim 8 wherein the input signal has a first sample rate and the quantized output signal has a second sample rate, which is less than the first sample rate.

10. The method of claim 8 further comprising a subtracting the quantized output signal from the modified input signal to generate the quantization error.

11. The method of claim 8 wherein applying the gravity effect further comprises adding a gravity value to a lesser of the first error value and the second error value.

12. The method of claim 8 wherein applying the gravity effect further comprises subtracting a gravity value from a greater of the first error value and the second error value.

13. The method of claim 8 wherein the gravity effect is operable to set the first error value equal to the second error value when the first error value minus the second error value is less than two times a gravity value.

14. The method of claim 8 wherein generating the feedback signal further comprises generating the feedback signal from the first error value and the second error value.

15. A delta sigma modulator comprising:
- an adder operable to receive an input signal and a feedback signal, and output a modified input signal;
- a quantizer operable to receive the modified input signal and output a quantized output signal, the quantized output signal having a corresponding quantization error; and
- a feedback filter operable to receive the quantization error and generate the feedback signal, the feedback filter comprising:
  - a first memory element having a first quantization error value from a first cycle;
  - a second memory element having a second quantization error value from a second cycle;
  - a gravity component operable to modify the first quantization error value and modify the second quantization error value to converge the first quantization error value and second quantization error over a plurality of cycles; and
  - a feedback signal generator operable to generate the feedback signal from the modified first quantization error value and modified second quantization error value.

16. The delta sigma modulator of claim 15 wherein the input signal has a first sample rate and the quantized output signal has a second sample rate, which is less than the first sample rate.

17. The delta sigma modulator of claim 15 further comprising a subtractor operable to receive the modified input signal and subtract the quantized output signal to generate a value representing the quantization error.

18. The delta sigma modulator of claim 15 wherein the gravity component is operable to add a gravity value to a lesser of the first quantization error value and the second quantization error value.

19. The delta sigma modulator of claim 15 wherein the gravity component is operable to subtract a gravity value from a greater of the first quantization error value and the second quantization error value.

20. The delta sigma modulator of claim 15 wherein the feedback filter further comprises a third component having a third quantization error value; and wherein the gravity component is further operable to converge the first quantization error value, the second quantization error value and the third quantization error value when the input signal is approximately zero.

\* \* \* \* \*